United States Patent [19]

Kim

[11] Patent Number: 5,619,049
[45] Date of Patent: Apr. 8, 1997

[54] CCD-TYPE SOLID STATE IMAGE PICKUP WITH OVERFLOW DRAIN STRUCTURE

[75] Inventor: Bum-sik Kim, Suwon, Rep. of Korea

[73] Assignee: Samsung Electronics Co., Ltd., Suwon, Rep. of Korea

[21] Appl. No.: 246,232

[22] Filed: May 18, 1994

[30] Foreign Application Priority Data

May 18, 1993 [KR] Rep. of Korea ............... 93-8468

[51] Int. Cl.$^6$ .............. H01L 27/148; H01L 29/768; H01L 31/0232
[52] U.S. Cl. .............. 257/223; 257/230; 257/232; 257/435
[58] Field of Search ..................... 257/223, 230, 257/232, 435

[56] References Cited

U.S. PATENT DOCUMENTS 5,045,906  9/1991  Nagaya ........................... 257/230
5,327,004  7/1994  Kurusu et al. ................... 257/435
5,349,216  9/1994  Lee et al. ........................ 257/223

OTHER PUBLICATIONS

Blooming Suppression Mechanism for an Interline CCD Image Sensor with a Vertical Overflow Drain, pp. 501–504, 19883 IEEE IEDM.
A ⅓-in 510 (H)×492(V) CCD Image Sensor with Mirror Image Function, pp. 954–959, 1991 IEEE Transactions on Electron Devices, vol. 38, No. 5, May 1991.

*Primary Examiner*—Gene M. Munson
*Attorney, Agent, or Firm*—Cushman Darby & Cushman, IP Group of Pillsbury Madison & Sutro LLP

[57] ABSTRACT

A charge-coupled device type solid state image pickup in which the overflow drain is formed at a high concentration on each photo-sensitive well. A high-concentration impurity layer is formed in the top layer of a PNPN structure to act as a drain against overflow. The structure enables overflow and electronic shutter operation even under low voltage conditions and may be realized on a chip.

17 Claims, 6 Drawing Sheets

CCD-TYPE SOLID STATE IMAGE PICKUP WITH OVERFLOW DRAIN STRUCTURE

BACKGROUND OF THE INVENTION

The present invention relates to a charge-coupled device (CCD) type solid state image pickup device, and more particularly, to a CCD-type solid state image pickup device in which an overflow drain (OFD) is formed around the surface of the semiconductor substrate.

A solid state image pickup device forms a pickup area where a solid element having a photoelectric conversion function and a signal accumulating function is utilized as one pixel. The signal charge accumulated in each pixel is converted into an electrical signal so that external image data detected by a multiplicity of pixels can be converted into an electrical signal.

Solid state image pickup devices typically use one of two signal scanning methods, an X-Y addressing system or a signal transfer system. According to the X-Y addressing system, the signal charge of each pixel is selectively read to obtain an output. A MOS-type solid state image pickup is a commercially available example of a device using the X-Y addressing method. According to the signal transfer system, the signal charge of each pixel is converted into an analog signal which is transferred to elements outside the pixel and serially read with analog signals associated with other pixels. A CCD-type solid state image pickup is one example of a device using the signal transfer method.

A CCD-type solid state image pickup can be further divided into two types, depending upon the transfer method used. A CCD-type solid state image pickup may use a frame transfer system, which includes an image sensing area for converting incident light into a signal charge, an accumulator for accumulating the signal charge, and a vertical transfer CCD for vertically conveying the signal charge. Alternatively, a CCD-type solid state image pickup may use an interline transfer system, which includes a photo-sensitive well for generating a signal charge in accordance with the strength of incident light, a vertical transfer CCD for vertically conveying the signal charge, a horizontal transfer CCD for horizontally conveying the signal charge conveyed from the vertical transfer CCD, and an output circuit portion for detecting the signal charge conveyed from the horizontal transfer CCD.

FIG. 1 is a diagram of a conventional CCD-type solid state image pickup using the interline transfer system.

Referring to FIG. 1, mask patterns 10 each form a photo-electric conversion region, i.e., a photo-sensitive well. Mask patterns 11 are interspersed between mask patterns 10, and each mask pattern 11 forms a channel region of a vertical transfer CCD. Each of mask patterns 13 forms a first transfer electrode of the vertical transfer CCD. Each of mask patterns 14 forms a second transfer electrode of the vertical transfer CCD. Mask pattern 12 forms a transfer channel for transferring the signal charge of a photo-electric conversion region to the vertical transfer CCD. Mask pattern 12 is disposed between mask patterns 10 and 11 and overlaps mask pattern 13. The mask patterns which form the horizontal transfer CCD and output circuit portion around the pixel cell array are not shown here.

A photo-shield film will be shown hereinafter, but is not shown in FIG. 1. FIG. 2 is a section view taken along line II—II of FIG. 1.

As shown in FIG. 1 and FIG. 2, the CCD-type solid state pickup employing an interline transfer system includes a P type well 38 formed in an N type semiconductor substrate 37. Photo-sensitive N type well 40 is formed in the P type well and accumulate a signal charge in response to incident light. N type channel region 41 of the vertical transfer CCD transfers the signal charge conveyed from the photo-sensitive well 40 to the horizontal transfer CCD and is formed vertically (refer to mask pattern 11 of FIG. 1) between separate photo-sensitive wells 40. Transfer channel 42 transfers the signal charge accumulated in the photo-sensitive well 40 to the N type channel region 41 of the vertical transfer CCD. First transfer electrodes 43 of the vertical transfer CCD receive a pulse for transferring the signal charge accumulated in a photo-sensitive well 40 to the vertical transfer CCD and a pulse for subsequently transferring the signal charge transferred from the photo-sensitive well 40 to the horizontal transfer CCD. A second transfer electrode (refer to mask pattern 14 of FIG. 1) of the vertical transfer CCD receives the pulse for subsequently transferring the signal charge transferred from the photo-sensitive well 40 to the horizontal transfer CCD. A horizontal transfer CCD (not shown) is formed in the horizontal direction around a pixel cell array and transfers the signal charges transferred from a plurality of vertical transfer CCDs to an output circuit (not shown). The output circuit outputs the signal charge transferred from the horizontal transfer CCD.

Referring to FIG. 2, reference numeral 36 denotes a channel stopper layer for separating each cell, 45 denotes an insulating film, and 46 denotes a photo-shield film.

In operation, when visible light is irradiated onto photo-sensitive well 40, an electrical signal charge is generated by the photon effect. The accumulated signal charge is proportional to the intensity of the irradiated light. During a field shift, the signal charge is transferred from photo-sensitive well 40 to channel region 41 via transfer channel 42 formed between photo-sensitive well 40 and channel region 41 of the vertical transfer CCD.

Next, the signal charge is conveyed from channel region 41 to the horizontal transfer CCD (not shown) by a clock pulse applied to first transfer electrodes 43 and the second transfer electrodes (mask pattern 14 shown in FIG. 1). The horizontal transfer CCD (not shown) is formed in the end of channel region 11 of the vertical transfer CCD. The signal charge is then transferred to an output circuit portion in the same manner, where it is detected as a voltage level.

However, in this solid state image pickup, there is a limit to the amount of signal charge that can be accumulated into the potential well corresponding to each photo-sensitive well. Specifically, when high-intensity visible light is irradiated onto the solid state image pickup, the signal charge generated in proportion to the intensity of the visible light may exceed the accumulation capacitance of the potential well and leak out. Such leakage may cause a blooming phenomenon in which the picture of a highlight portion is extended. If the signal charge flows into the adjacent vertical and horizontal transfer CCD, a smear phenomenon occurs. To prevent these phenomena, excess signal charge should be periodically discharged to an external circuit.

There have been various methods proposed for discharging the extra signal charge to an external circuit, including a CCD-type solid state image pickup where the vertical overflow drain (OFD) is formed beneath the photo-sensitive well (see Eiji Oda et al., "Blooming Suppression Mechanism for an Interline CCD Image Sensor with a Vertical Overflow Drain," IEDM 1983, pp 501–504).

FIG. 3 is a sectional view of a CCD-type solid state pickup corresponding to FIG. 2 which has a PNPN OFD structure (see Junichi Hojo et al., "A ⅓-inch 510(H)×492(V) CCD Image Sensor with Mirror Image Function," IEEE Trans-electron Device, Vol. 38, No. 5, May 1991, pp 954–959).

As shown in FIG. 3, the CCD-type solid state image pickup having the above-described overflow drain structure includes a P⁻ type first well 58 formed toward the surface of a N− type semiconductor substrate 57 which serves as an overflow barrier to suppress blooming. Photosensitive N type well 60 is formed on the surface of the first well 58 so as to accumulate the signal charge excited by incident light. P⁺ type dark-current suppressing layer 59 is formed by implanting high concentration boron ions to a photo-sensitive well and reduces dark-current, suppresses blooming, and enables the realization of a variable speed electronic shutter. N type channel region 61 of a vertical transfer CCD transfers a signal charge from the photo-sensitive well to a horizontal transfer CCD. P type second well 55 is formed beneath the channel region. Transfer channel 62 transfers the signal charge accumulated in the photo-sensitive well to an N type channel region of a vertical transfer CCD. A channel stopper layer 56 separates each cell. Photo shield film 66 is formed on a semiconductor substrate of the region where a photo-sensitive well is not formed. First transfer electrode 63 receives a pulse for transferring the signal charge accumulated in a photo-sensitive well to a vertical transfer CCD and a pulse for subsequently transferring the signal charge to a horizontal transfer CCD. A second transfer electrode (not shown) receives the pulse for subsequently transferring the signal charge to a horizontal transfer CCD. A horizontal transfer CCD (not shown) is formed around a pixel cell array and transfers the signal charge transferred from a plurality of vertical transfer CCDs to an output circuit (not shown), which outputs the signal charge transferred from the horizontal transfer CCD.

FIG. 4 shows the distribution of electric potential on line IV—IV of FIG. 3.

In operation, when visible light is irradiated onto photo-sensitive well 60, a signal charge, i.e., electrons excited in proportion to the incident light energy, is accumulated in the photo-sensitive well. When the signal charge accumulated in the potential well of the photo-sensitive well 60 exceeds the accumulation capacity of the photo-sensitive well, the signal charge flows towards the semiconductor substrate 57 only after going over the potential barrier of P⁻ type first well 58. Thus, signal charge flow into the photo-sensitive well environment and transfer CCD is prevented.

When semiconductor substrate 57 acts as a drain against overflow, the distribution of the electric potential on line IV—IV of FIG. 3 according to an overflow operation voltage $V_{OFD}$ applied to N⁻ type semiconductor substrate 57 is as shown by the solid line in FIG. 4.

Referring to FIG. 5, the amount of signal charge optically excited and accumulated in the photo-sensitive well is, until overflow occurs, proportional to the intensity of the irradiated light. Once overflow occurs, the amount of signal charge is held constant. Accordingly, blooming and smears can be prevented since the excessive signal charge flows toward semiconductor substrate 57 instead of toward the adjacent photo-sensitive well, the transfer CCD, etc.

In a conventional solid state image pickup, the time period for signal charge accumulation is equal to one field period (16.7 ms). To improve the resolution for fast-moving subjects, the signal charge accumulating time period has to be kept shorter than one field period. Accordingly, it has been proposed to control the signal charge accumulation time period in a solid state pickup by a variable speed shutter (see U.S. Pat. Nos. 5,014,132 (Title; CCD Image, Inventor; Kumesama, Tetsuro, application No. 383,179), 5,045,906 (Title; SOLID STATE IMAGE PICKUP DEVICE HAVING PHOTO-ELECTRIC CONVERTING REGION VIA SCHOTTKY BARRIER, Inventor; Kazuhisa Nagaya, application No. 559,035) and 4,875,100 (Title; ELECTRONIC SHUTTER FOR A CCD IMAGE SENSOR, Inventor; Kazuya Yonemoto et al, application No. 110,844)).

As described in U.S. Pat. No. 4,875,100, when an electronic shutter voltage is applied to the N⁻ type semiconductor substrate 57, the distribution of the electric potential, illustrated by the dotted line of FIG. 4, depends on the applied shutter voltage ($\Delta V_{SHT}$). In this manner, all signal charges accumulated in the potential well may be removed.

FIG. 6 is a simple timing diagram of an electronic shutter operation. In general, the time period for accumulating the signal charge into a photo-sensitive well is equal to one field period, i.e., 1/60th of a second. When an electronic shutter operates such that shutter voltage pulses having an amplitude of $\Delta V_{SHT}$ are continuously added to an OFD operation voltage ($V_{OFD}$) level over a time $T_0$, the signal charge is accumulated for the period of $1/60-T_0$ seconds. Thus, the amount of the accumulated charge can be controlled.

A CCD-type solid state image pickup having the conventional OFD structure has the following problems. First, N⁻ type semiconductor substrate 57 which performs a vertical-type OFD operation is formed by low-concentration impurity implantation. Accordingly, when an OFD operation is to be performed, a high voltage must be applied to the semiconductor substrate. Second, when a shutter operation is performed in a vertical-type OFD structure, a high-voltage shutter pulse is also needed in order to control the potential barrier of P⁻ type first well 58. Third, since the N⁻ type semiconductor substrate which performs an OFD operation is formed throughout the whole chip, on-chip circuit realization is difficult when additional PMOS and CMOS circuits are to be formed outside the image sensing area of a solid state image pickup.

SUMMARY OF THE INVENTION

It is an object of the present invention to provide a CCD-type solid state image pickup wherein OFD operations and electronic shutter operations are possible even under low voltage conditions.

It is another object of the present invention to provide a CCD-type solid state image pickup with an OFD structure which may be realized on a chip.

To accomplish these objects and other advantages, the present invention provides for a CCD-type solid state image pickup having an overflow drain formed around the surface of a semiconductor substrate and a light receiving portion formed beneath the overflow drain.

According to the present invention, the overflow drain includes a first impurity diffusion region of a first conduction type. The light receiving portion includes a second impurity diffusion region of a second conduction type for suppressing dark current, a third impurity diffusion region of the first conduction type for accumulating a signal charge generated by incident light, a fourth impurity diffusion region of the second conduction type and a fifth impurity diffusion region of the first conduction type. The first conduction type is preferably N type.

The impurity concentration of the first impurity diffusion region is preferably higher than that of the second impurity diffusion region, the impurity concentration of the second impurity diffusion region is preferably higher than that of the third impurity diffusion region, the impurity concentration of the third impurity diffusion region is preferably higher than that of the fourth impurity diffusion region, and the impurity concentration of the fourth impurity diffusion region is preferably higher than that of the fifth impurity diffusion region.

According to a first embodiment of the present invention, the overflow drain is connected with a part of the photo-shield film formed on the semiconductor substrate but not on the light receiving region. The photo-shield film may be constituted by aluminum or polycrystalline silicon.

According to another embodiment of the present invention, the light receiving portion is constituted by the third impurity diffusion region of the first conduction type in which a signal charge excited by incident light is accumulated, the fourth impurity diffusion region of the second conduction type and the fifth impurity diffusion region of the first conduction type. According to this embodiment, the second impurity diffusion region of the second conduction type for suppressing the dark current and the overflow drain are formed on the light receiving portion. Further, a barrier layer consisting of a sixth impurity diffusion region of the second conduction type is formed between the overflow drain and the light receiving portion.

According to another embodiment of the present invention, a bias applying means layer is formed on the overflow drain and is constituted by a material which can form an ohmic contact when deposited on the overflow drain, for example, transparent Indium-Tin Oxide (ITO) or polycrystalline silicon.

According to another embodiment of the present invention, the light receiving portion is constituted by the second impurity diffusion region of the second conduction type for suppressing dark current, the third impurity diffusion region of the first conduction type in which a signal charge excited by incident light is accumulated, and the fourth impurity diffusion region of the second conduction type. According to this embodiment, the impurity concentration of the second impurity diffusion region is higher than that of the third impurity diffusion region, while the impurity concentration of the first impurity diffusion region is higher than that of the second impurity diffusion region.

BRIEF DESCRIPTION OF THE DRAWINGS

The above objects and other advantages of the present invention will become more apparent upon taking the following detailed description of presently preferred embodiments thereof in conjunction with the attached drawings in which.

DETAILED DESCRIPTION OF THE INVENTION

Figure 1:
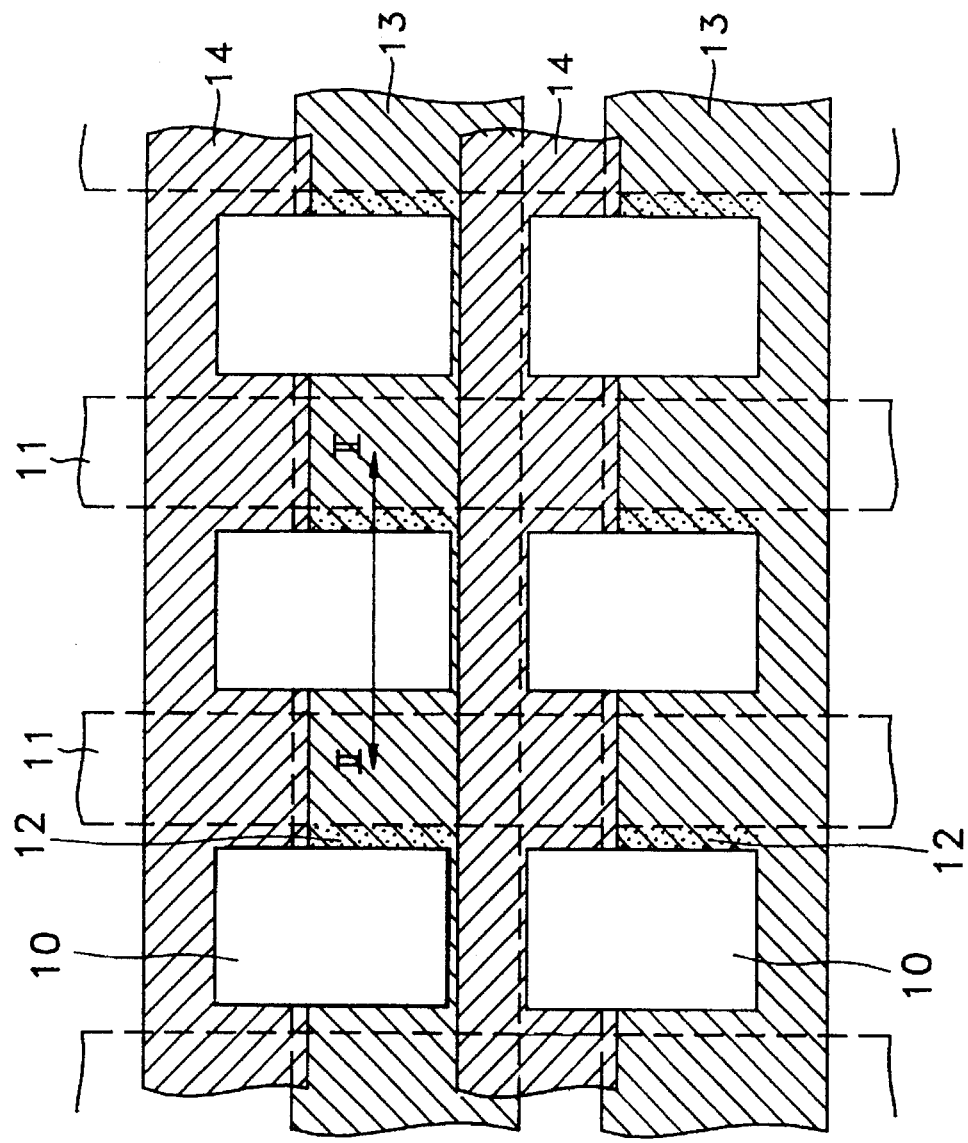
FIG. 1 is a pixel layout of a conventional CCD-type solid state image pickup.
Figure 2:
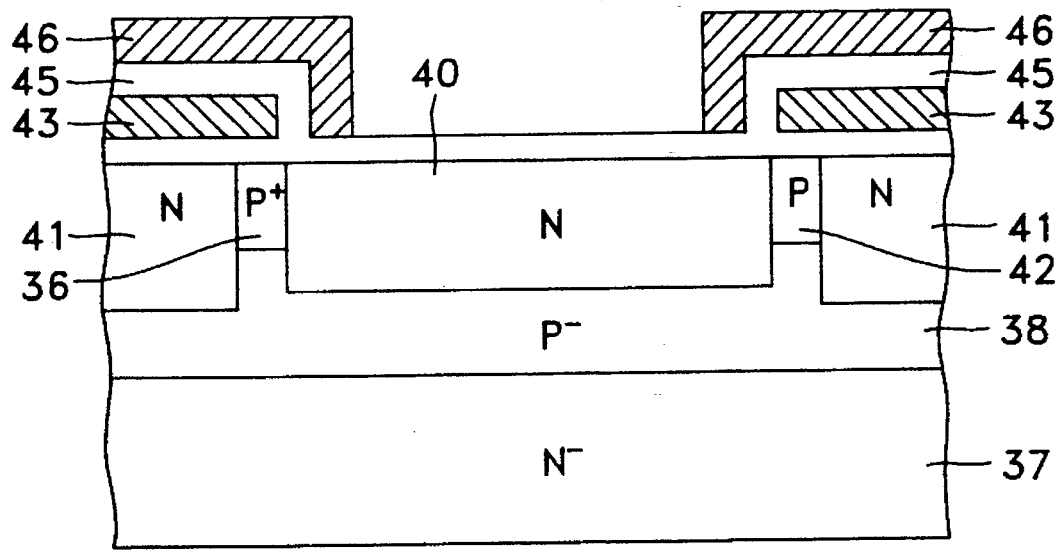
FIG. 2 is a section view taken along line II—II of FIG. 1 and shows a conventional CCD-type solid state image pickup employing an interline system.
Figure 3:
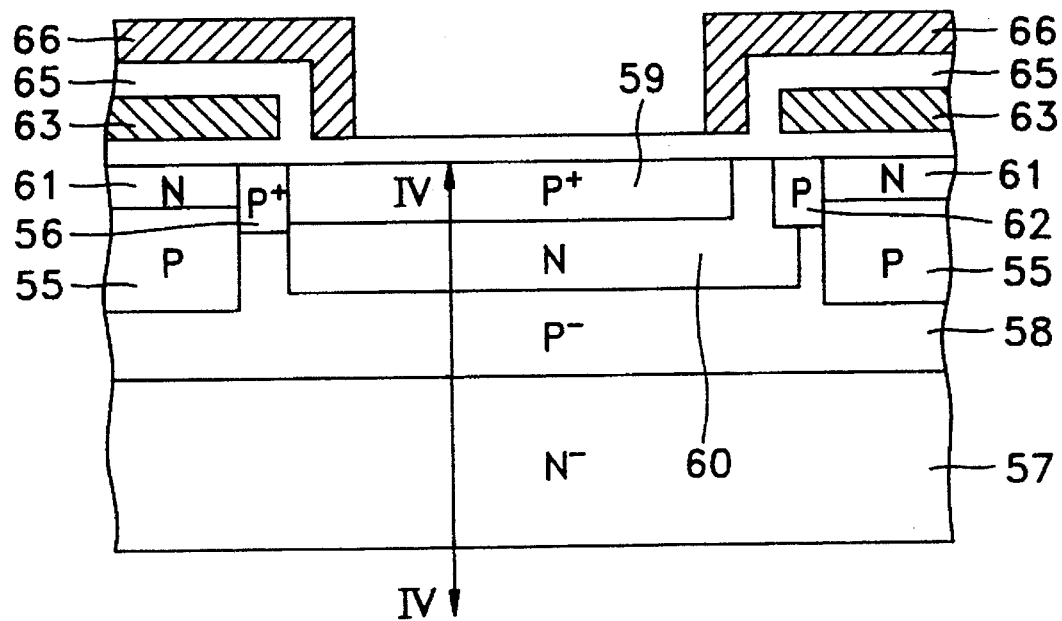
FIG. 3 is a section view corresponding to FIG. 2 and shows a conventional CCD-type solid state image pickup with a conventional overflow drain structure.
Figure 4:
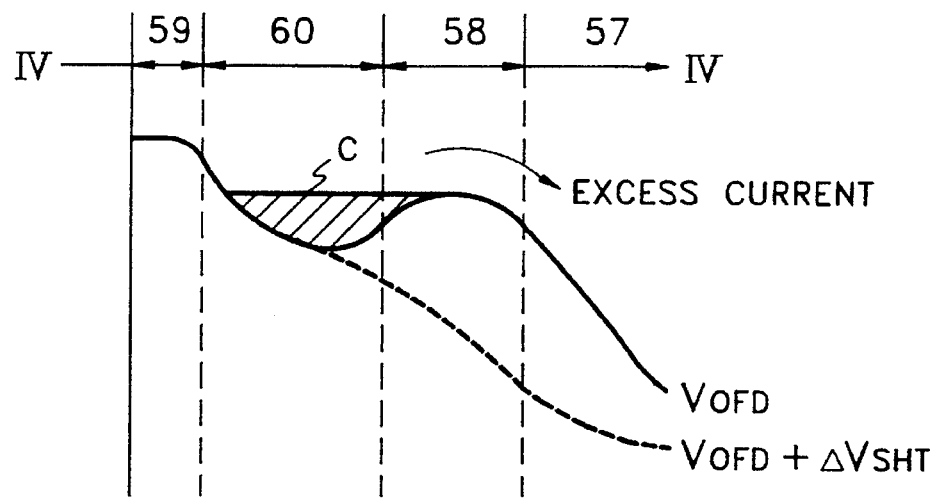
FIG. 4 is a diagram showing the potential distribution along line IV—IV of FIG. 3.
Figure 5:
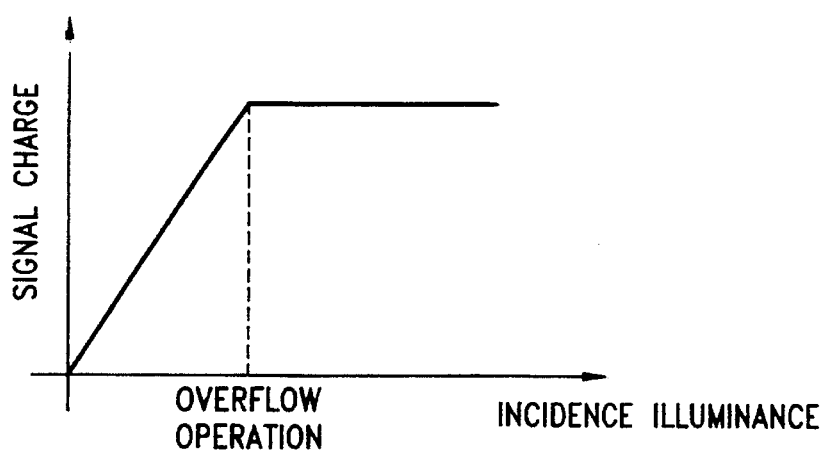
FIG. 5 is a diagram showing the relationship between a signal charge and the illuminance of the incident light irradiated onto a photo-sensitive well.
Figure 6:
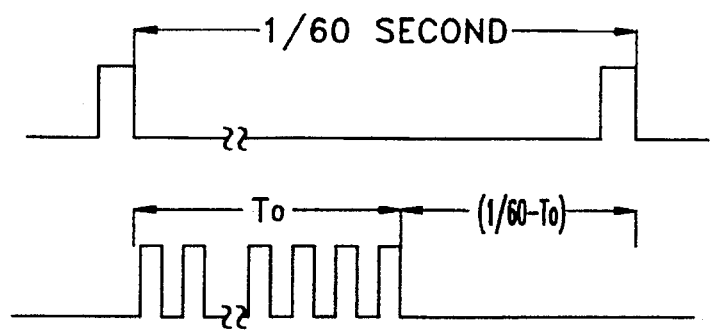
FIG. 6 is a timing diagram illustrating an electronic shutter operation in a conventional overflow drain structure.
Figure 7:
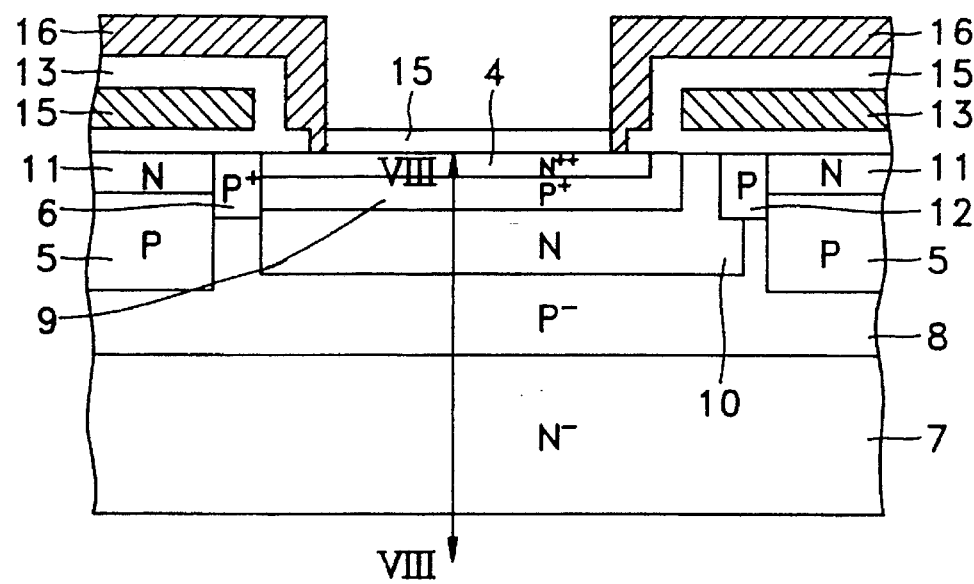
FIG. 7 is a section view showing the overflow drain structure of a CCD-type solid state image pickup manufactured according to a first embodiment of the present invention.

Referring now to FIG. 7, an overflow drain structure of the CCD-type solid state image pickup manufactured according to a first embodiment of the present invention is shown. The image pickup includes a light receiving portion constituted by an N⁻ type semiconductor substrate 7 (i.e., a fifth impurity diffusion region of a first conductivity) to which a DC voltage is applied, a P⁻ type first well 8 (i.e., a fourth impurity diffusion region of a second conductivity) which is formed toward the surface of the semiconductor substrate 7 and which operates as a potential barrier against overflow to suppress blooming, a photo-sensitive N type well 10 (i.e., a third impurity diffusion region of the first conductivity) which is formed toward the surface of the first well 8 where the signal charge excited by incident light is accumulated, and a P⁺ type dark-current suppression layer 9 (i.e., a second impurity diffusion region of the second conductivity) formed by a high-concentration implantation of boron ions into the photo-sensitive well 10 to reduce dark-current, suppress blooming and operate as a variable speed electronic shutter.

An N⁺⁺ type OFD 4 (i.e., a first impurity diffusion region of the first conductivity) is formed by implanting a high concentration of N type impurities into the P⁺ type dark-current suppression layer 9 and operates as a drain against overflow. A transfer channel 12 transfers the signal charge accumulated in the photo-sensitive well 10 to N type channel region 11 of a vertical transfer CCD. N type channel region 11 of the vertical transfer CCD transfers the signal charge to a horizontal transfer CCD (not shown). A P type second well 5 is formed beneath the channel region 11. A channel stopper layer 6 separates each cell. A photo-shield film 16 is formed in the regions other than the light receiving portion so as to shield incident light and is connected to OFD 4 partially to serve as means for applying an OFD voltage. First transfer electrode 13 receives a pulse for transferring the signal charge accumulated in the photo-sensitive well 10 to the vertical transfer CCD and a pulse for subsequently transferring the signal charge to the horizontal transfer CCD.

A second transfer electrode (not shown) receives the pulse for subsequently transferring the signal charge transferred from a photo-sensitive well to a horizontal transfer CCD (not shown). The horizontal transfer CCD is formed around a pixel cell array to transfer the signal charge to an output circuit (not shown).

According to this embodiment, it is desirable that photo-shield film 16 is formed of aluminum or polycrystalline silicon and that the impurity concentration of OFD 4 is higher than that of dark-current suppression layer 9. It is also desirable that the impurity concentration of dark-current suppression layer 9 is higher than that of photo-sensitive well 10, the impurity concentration of photo-sensitive well 10 is higher than that of first well 8, and the impurity concentration of first well 8 is higher than that of semiconductor substrate 7.

Figure 8:
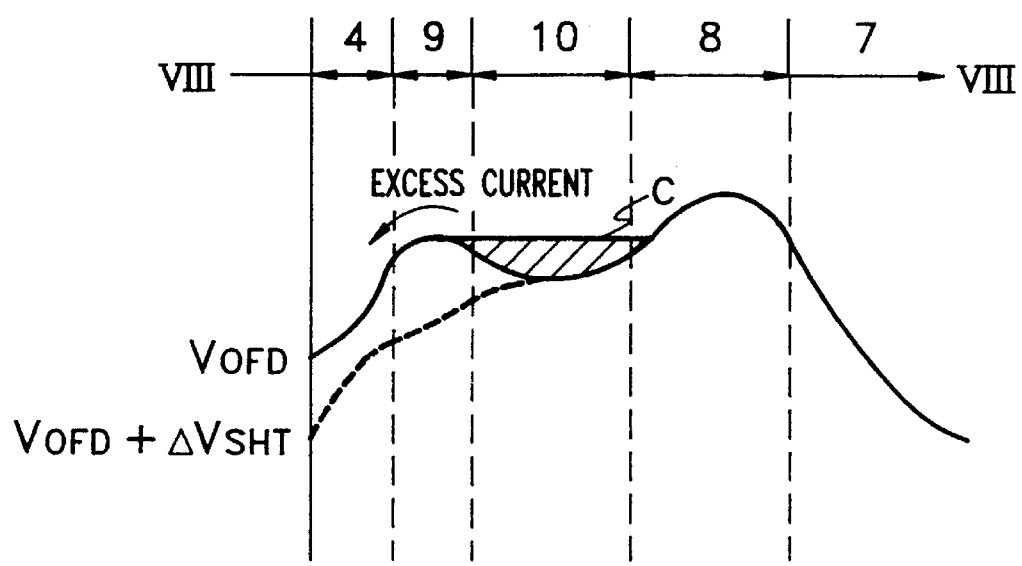
FIG. 8 is a diagram showing the potential distribution along line VIII—VIII of FIGS. 7 and 10.

FIG. 8 is a diagram showing the potential distribution along line VIII—VIII of FIG. 7. In FIG. 8, a predetermined DC voltage is applied to N⁻ type substrate region 7 and the potential well for accumulating a predetermined capacity of the signal charge (area "C" of FIG. 8) is formed in photo-sensitive well 10. When an OFD voltage ($V_{OFD}$) is applied to N⁺⁺ type OFD region 4 such that P⁺ type first well 8 acting as a barrier against overflow can be depleted, the distribution of the potential formed by the first well 8 and the dark-current suppression layer 9 is illustrated as the solid line in FIG. 8. Thus, the signal charge accumulated in the photo-sensitive well 10 is discharged in the direction of OFD region 4 having a low potential barrier.

Since the impurity concentration of OFD region 4 is high, the potential barrier of dark-current suppression region 9 is easily lowered even when a lower overflow drain voltage ($V_{OFD}$) is applied. In this manner, the overflow of signal charge accumulated in photo-sensitive well region 10 is possible.

The dotted line in FIG. 8 illustrates the potential distribution when the applied voltage includes an electronic shutter voltage ($\Delta V_{SHT}$). Electronic shutter operation is also possible under low voltage conditions for the same reason that overflow drain operation is possible.

According to this first embodiment of the present invention, since a high-concentration OFD 4 is formed on each photo-sensitive well 10 of the solid state image pickup, a constant DC bias voltage can be applied to N type semiconductor substrate 7, unlike prior solid state image pickups. Thus, PMOS and CMOS circuits can be realized in the peripheral circuit portion (that is, the area which excludes the cell array region) of a chip, and the solid state image pickup can be realized on the chip. In addition, since the impurity concentration OFD 4 is higher than that of P⁺ type dark-current suppression layer 9, the potential barrier of P⁺ type dark-current suppression layer 9 can be sufficiently controlled by a low OFD voltage and an electronic shutter voltage.

Figure 9:
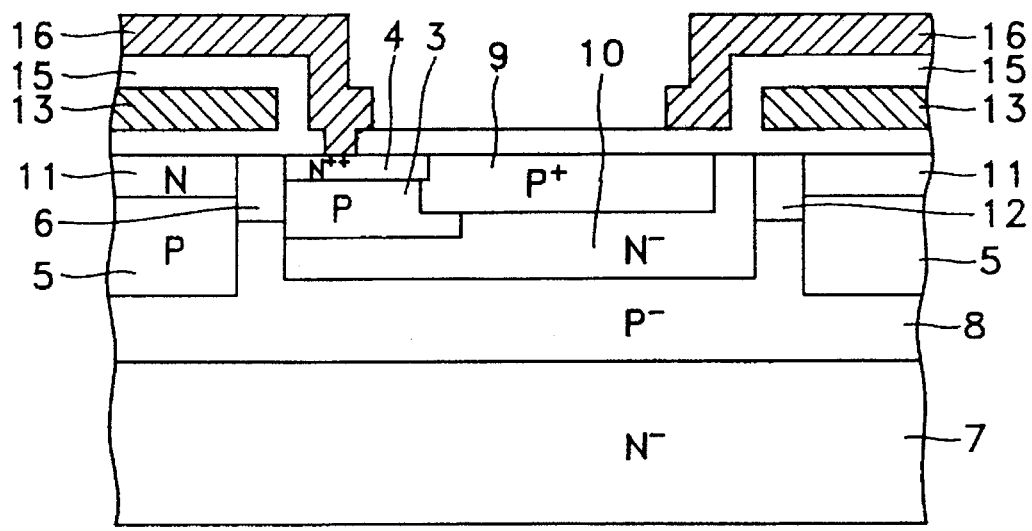
FIG. 9 is a section view showing the overflow drain structure of a CCD-type solid state image pickup manufactured according to a second embodiment of the present invention.

Referring now to FIG. 9, an OFD structure of a CCD-type solid state image pickup manufactured according to a second embodiment of the present invention is shown. According to this embodiment, an overflow drain is formed on each photo-sensitive well to obtain the effect of the first embodiment, while the dark-current suppression layer 9 is formed in the top portion of the semiconductor, to more easily suppress the generation of dark current generated in the surface of the semiconductor substrate.

Accordingly, P⁺ type dark-current suppression layer 9 is formed in the majority of the surface of photo-sensitive well 10, while N⁺⁺ type OFD 4 is formed along one upper edge of photo-sensitive well 10, for example, on the sides of channel stopper 6. P-type barrier layer 3 is formed between photo-sensitive well 10 and OFD 4 in order to control the electric potential barrier between N-type photo-sensitive well 10 and N⁺⁺ type OFD 4. Photo-shield film 16 is formed in regions other than the light receiving portion and is electrically coupled with N⁺⁺ type OFD 4 to serve as means for applying OFD and electronic shutter voltages.

Figure 10:
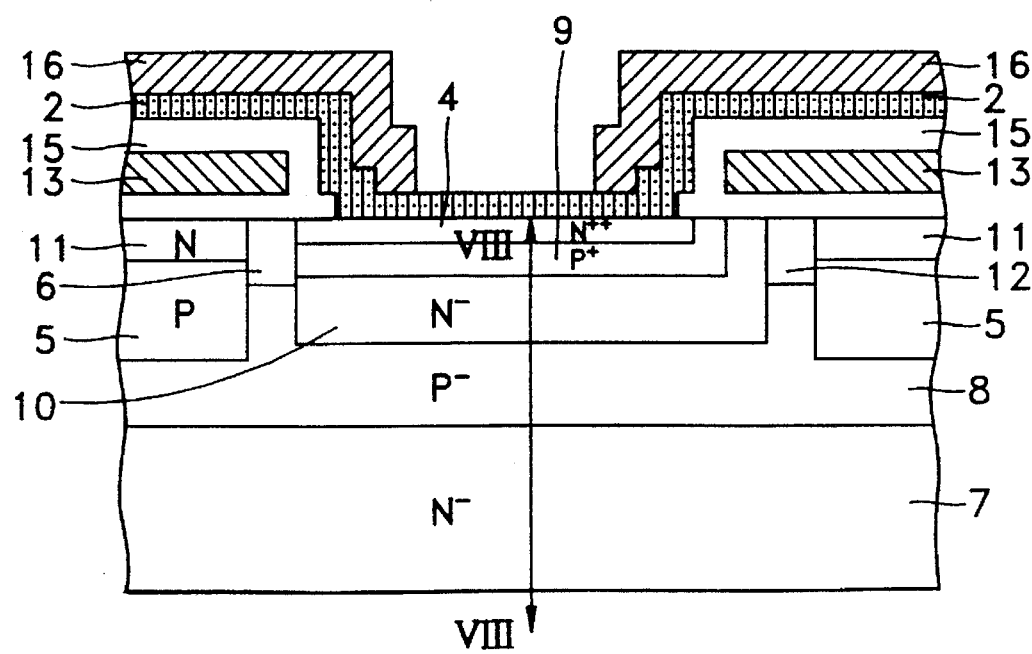
FIG. 10 is a section view showing the overflow drain structure of a CCD-type solid state image pickup manufactured according to a third embodiment of the present invention.

Referring now to FIG. 10, an overflow drain structure of the CCD-type solid state image pickup manufactured by a third embodiment of the present invention is shown. The structure of the device according to this embodiment is different from that of the first embodiment in that an ohmic layer 2 for applying an OFD voltage is formed by depositing appropriate material on the entire surface of the substrate. The material constituting ohmic layer 2 may be an ITO having excellent light transmissivity characteristics (transparency) or a thin layer of polycrystalline silicon and is deposited over the entire substrate surface prior to the formation of photo-shield film 16.

Figure 11:
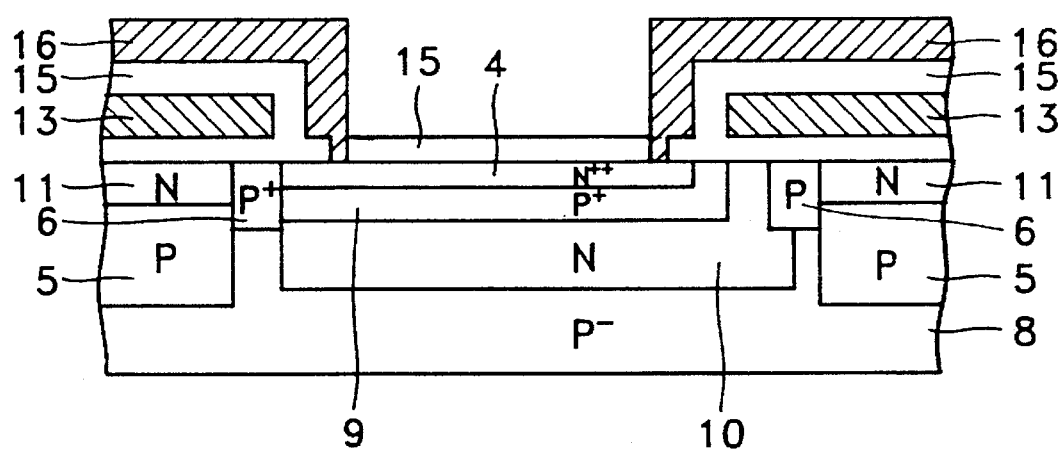
FIG. 11 is a section view showing the overflow drain structure of a CCD-type solid state image pickup manufactured according to a fourth embodiment of the present invention.

Referring now to FIG. 11, an overflow drain structure of the CCD-type solid state image pickup manufactured according to a fourth embodiment of the present invention is shown. The structure of the device according to this embodiment is different from that of the first embodiment in that P⁻ type first well 8 is used as the semiconductor substrate instead of the N⁻ type semiconductor substrate 7.

According to the present invention, an overflow drain is formed on each photo-sensitive well of a semiconductor substrate to maintain the semiconductor substrate at a constant voltage. Moreover, it is also possible to realize a peripheral circuit by a PMOS transistor or the like in the image sensing area environment of a solid state image pickup. Accordingly, a solid state image pickup can be manufactured on the chip. Further, since the overflow drain region is formed by high-concentration impurity doping, OFD and electronic shutter operation can be effectively performed under relatively low voltage conditions.

It is further understood that the foregoing description of the preferred embodiments of the disclosed device is intended to be illustrative and not limiting. Various changes and modifications may be made to the disclosed details without departing from the spirit and scope of the invention as defined by the appended claims and their equivalents.

What is claimed is:

1. A CCD-type solid state image pickup for providing an output by way of a horizontal charge-coupled device, comprising:

a substrate of a first conductivity type;

a first well formed in said substrate, said first well being of a second conductivity type;

a photo-sensitive well of said first conductivity type formed in said first well, said photo-sensitive well accumulating a signal charge proportional to the intensity of incident light;

a dark current suppression layer formed in said photo-sensitive well, said dark current suppression layer being of said second conductivity type, said substrate, said first well, said photo-sensitive well, and said dark current suppression layer constituting a light receiving region;

an overflow drain formed on said dark current suppression layer, said overflow drain being of said first conductivity type, the impurity concentration of said overflow drain being higher than that of said dark current suppression layer, the impurity concentration of said dark current suppression layer being higher than that of said photo-sensitive well, the impurity concentration of said photo-sensitive well being higher than that of said first well, and the impurity concentration of said first well being higher than that of said substrate; and a first transfer channel for transferring said accumulated signal charge from said photo-sensitive well to a second transfer channel, said second transfer channel transferring said accumulated signal to said horizontal charge coupled device.

2. The CCD-type solid state image pickup of claim 1, wherein said first conductivity type is N-type.

3. A CCD-type solid state image pickup for providing an output by way of a horizontal charge-coupled device, comprising:

a substrate of a first conductivity type;

a first well formed in said substrate, said first well being of a second conductivity type;

a photo-sensitive well of said first conductivity type formed in said first well, said photo-sensitive well accumulating a signal charge proportional to the intensity of incident light;

a dark current suppression layer formed in said photo-sensitive well, said dark current suppression layer being of said second conductivity type, said substrate, said first well, said photo-sensitive well, and said dark current suppression layer constituting a light receiving region;

an overflow drain formed on said dark current suppression layer, said overflow drain being of said first conductivity type, said overflow drain being connected to a photo-shield film formed on portions of said substrate excluding said light receiving region;

a first transfer channel for transferring said accumulated signal charge from said photo-sensitive well to a second transfer channel, said second transfer channel transferring said accumulated signal to said horizontal charge coupled device; and an ohmic contact formed over the entire substrate, wherein an ohmic layer is formed between said overflow drain and said photo-shield film.

4. The CCD-type solid state image pickup of claim 3, wherein said photo-shield film is aluminum.

5. The CCD-type solid state image pickup of claim 3, wherein said photo-shield film is polycrystalline silicon.

6. The CCD-type solid state image pickup of claim 3, wherein said ohmic layer is formed of transparent Indium-Tin Oxide.

7. The CCD-type solid state image pickup of claim 3, wherein said ohmic layer is formed of polycrystalline silicon.

8. A CCD-type solid state image pickup for providing an output by way of a horizontal charge-coupled device, comprising;

a substrate of a first conductivity type;

a first well formed in said substrate, said first well being of a second conductivity type;

a photo-sensitive well of said first conductivity type formed in said first well, said photo-sensitive well accumulating a signal charge proportional to the intensity of incident light;

a dark current suppression layer formed in a first portion of said photo-sensitive well, said dark current suppression layer being of said second conductivity type, said substrate, said first well, said photo-sensitive well, and said dark current suppression layer constituting a light receiving region;

a barrier layer formed in a second portion of said photo-sensitive well, said barrier layer being of said second conductivity type;

an overflow drain formed on said barrier layer adjacent to said dark current suppression layer, said overflow drain being of said first conductivity type, the impurity concentration of said overflow drain being higher than that of said dark current suppression layer, the impurity concentration of said dark current suppression layer being higher than that of said photo-sensitive well, the impurity concentration of said photo-sensitive well being higher than that of said first well, and the impurity concentration of said first well being higher than that of said substrate; and a first transfer channel for transferring said accumulated signal charge from said photo-sensitive well to a second transfer channel, said second transfer channel transferring said accumulated signal charge to said horizontal charge coupled device, wherein said light receiving region is constituted such that said dark current suppression layer is a first impurity diffusion region of said second conductivity type, said photo-sensitive well is a second impurity diffusion region of said first conductivity type, said first well is a third impurity diffusion region of a second conductivity type and said substrate is a fourth impurity diffusion region of said first conductivity type.

9. The CCD-type solid state image pickup of claim 8, wherein said first conductivity type is N-type.

10. The CCD-type solid state image pickup of claim 8, wherein said overflow drain is connected to a photo-shield film formed on portions of said substrate excluding said light receiving region.

11. The CCD-type solid state image pickup of claim 10, wherein said photo-shield film is aluminum.

12. The CCD-type solid state image pickup of claim 10, wherein said photo-shield film is polycrystalline silicon.

13. A CCD-type solid state image pickup for providing an output by way of a horizontal charge-coupled device, comprising:

a first well formed of a first conductivity type;

a photo-sensitive well of a second conductivity type formed in said first well, said photo-sensitive well accumulating a signal charge proportional to the intensity of incident light;

a dark current suppression layer formed in said photo-sensitive well, said dark current suppression layer being of said first conductivity type, said first well, said photosensitive well, and said dark current suppression layer constituting a light receiving region;

an overflow drain formed on said dark current suppression layer, said overflow drain being of said second conductivity type, the impurity concentration of said overflow drain is higher than that of said dark current suppression layer, the impurity concentration of said dark current suppression layer being higher than that of said photo-sensitive well, and the impurity concentration of said photo-sensitive well being higher than that of said first well; and a first transfer channel for transferring said accumulated signal charge from said photo-sensitive well to a second transfer channel, said second transfer channel transferring said accumulated signal to said horizontal charge coupled device.

14. The CCD-type solid state image pickup of claim 13, wherein said first conductivity type is P-type.

15. The CCD-type solid state image pickup of claim 13, wherein said overflow drain is connected to a photo-shield film formed on portions of said first well excluding said light receiving region.

16. The CCD-type solid state image pickup of claim 15, wherein said photo-shield film is aluminum.

17. The CCD-type solid state image pickup of claim 15, wherein said photo-shield film is polycrystalline silicon.

* * * * *